United States Patent [19]

Konrad

[11] 4,454,503

[45] Jun. 12, 1984

[54] TRANSISTOR FAULT INDICATOR

[75] Inventor: Charles E. Konrad, Roanoke, Va.

[73] Assignee: General Electric Company, Salem, Va.

[21] Appl. No.: 299,047

[22] Filed: Sep. 3, 1981

[51] Int. Cl.³ ............................................. G08B 21/00
[52] U.S. Cl. ................................... 340/648; 340/635;
318/641; 361/92
[58] Field of Search ............... 340/654, 653, 652, 644,
340/655, 635; 318/345 F, 346, 341, 490, 139;
324/158 T; 323/351; 361/18, 101, 92

[56] References Cited

U.S. PATENT DOCUMENTS

| | | | |
|---|---|---|---|
| 3,818,291 | 6/1974 | Miyake | 318/341 |
| 3,914,675 | 10/1975 | Konrad | 318/139 |
| 4,017,775 | 4/1977 | Artrip | 318/139 |
| 4,126,889 | 11/1978 | Ibamoto et al. | 318/341 |
| 4,275,342 | 6/1981 | Kawada et al. | 340/648 |
| 4,355,342 | 10/1982 | Franzolini | 318/341 |

Primary Examiner—Gerald L. Brigance
Attorney, Agent, or Firm—Ormand R. Austin; Arnold E. Renner

[57] ABSTRACT

A transistor fault indicator circuit monitors the conduction state of a transistor and compares that state to a commanded state. Differences in states are treated as faults and actuate an alarm or shut down the system including the transistor. In systems in which the transistor may be operated in a continuous conduction mode for long time periods, a control circuit is provided to periodically short circuit the base-emitter bias of the transistor to force a momentary period of nonconduction during which time the proper operation of the transistor can be verified.

9 Claims, 2 Drawing Figures

TRANSISTOR FAULT INDICATOR

BACKGROUND OF THE INVENTION

The present invention relates to fault indicator circuits and, more particularly, to fault indicator circuits for detecting and responding to failure of a transistor in a switching power regulator.

Electronic fault indicator circuits have been applied to switching power regulators wherein the switching power device is a silicon controlled rectifier (SCR). In such SCR circuits, power is regulated by time ratio control of the SCR and the fault indicator circuit typically measures the impedance of the SCR or the time period for which it is conductive. If the conduction time period exceeds some predetermined limit, a fault indication is provided. A typical example of such a fault detector circuit is shown in U.S. Pat. No. 3,914,675 issued Oct. 21, 1975, and assigned to General Electric Company.

Other types of fault indicator circuits depend upon an excess of current flowing in the switching devices in order to trip an overcurrent device. Such overcurrent devices may comprise overcurrent relays of a type well known in the art or static fuses. However, in some applications a fault may not be evident by excessive current. More particularly, a fault in a component of a control circuit may result in misoperation of some other portion of the system without any indication of a fault existing in the control itself.

An example of a system in which a control fault does not create an overcurrent condition in the control but does create misoperation of another part of the system is in a control system for an electrically powered vehicle such as, for example, a fork lift truck. In such a system, a plurality of electomechanical switches are provided to prevent operation of the vehicle unless an operator is seated upon the driver seat to thereby enable a seat mounted switch, a key switch has been turned to an ON position, and a direction control lever has been placed in either a forward or reverse position. All of these electromechanical switches typically provide control signals which allow a solid state device such as a transistor to be gated into conduction and thereby provide power to energizing relay coils which in turn permit power to be applied to the drive motors of the vehicle. However, if the solid state device has failed in a short circuit condition, none of the aforementioned electromechanical switches will be effective to restrict the application of power to the vehicle.

It is an object of the present invention to provide a fault indicator circuit for use with a transistorized power regulator for indicating failure of the transistor regulator.

SUMMARY OF THE INVENTION

In accordance with one aspect of the present invention, a transistor connected in a time ratio control switching power regulator is provided with a fault indicator circuit which monitors the conduction state of the transistor and compares it to the commanded conduction state to thereby provide a fault indication upon disagreement between the actual and commanded conduction states. The fault indicator circuit comprises an exclusive OR logic circuit having one input terminal connected to monitor the commanded conduction state and a second input terminal connected to monitor the actual conduction state of the transistor. Disagreement between the two states results in an output signal being generated by the exclusive OR circuit which signal is then used to energize a fault indicator. The energizing signal is preferably applied to a latching device such as a bistable flip-flop which in turn supplies energizing power to a lamp to signal a failed condition or to interrupt power to the system.

In an alternate embodiment, applicable in a system in which the transistor regulator is maintained in continuous conduction rather than time ratio controlled, a gating pulse circuit is employed to periodically force the transistor out of conduction for a relatively brief time period. The fault indicator circuit then verifies the proper operation of the transistor or indicates a fault if the transistor fails to respond to the gating pulse circuit.

BRIEF DESCRIPTION OF THE DRAWINGS

Although the specification concludes with claims particularly pointing out and distinctly claiming the subject matter which is regarded as the invention, it is believed that the invention will be better understood from the following description of the preferred embodiment taken in conjunction with the accompanying drawings in which:

DETAILED DESCRIPTION

Figure 1:
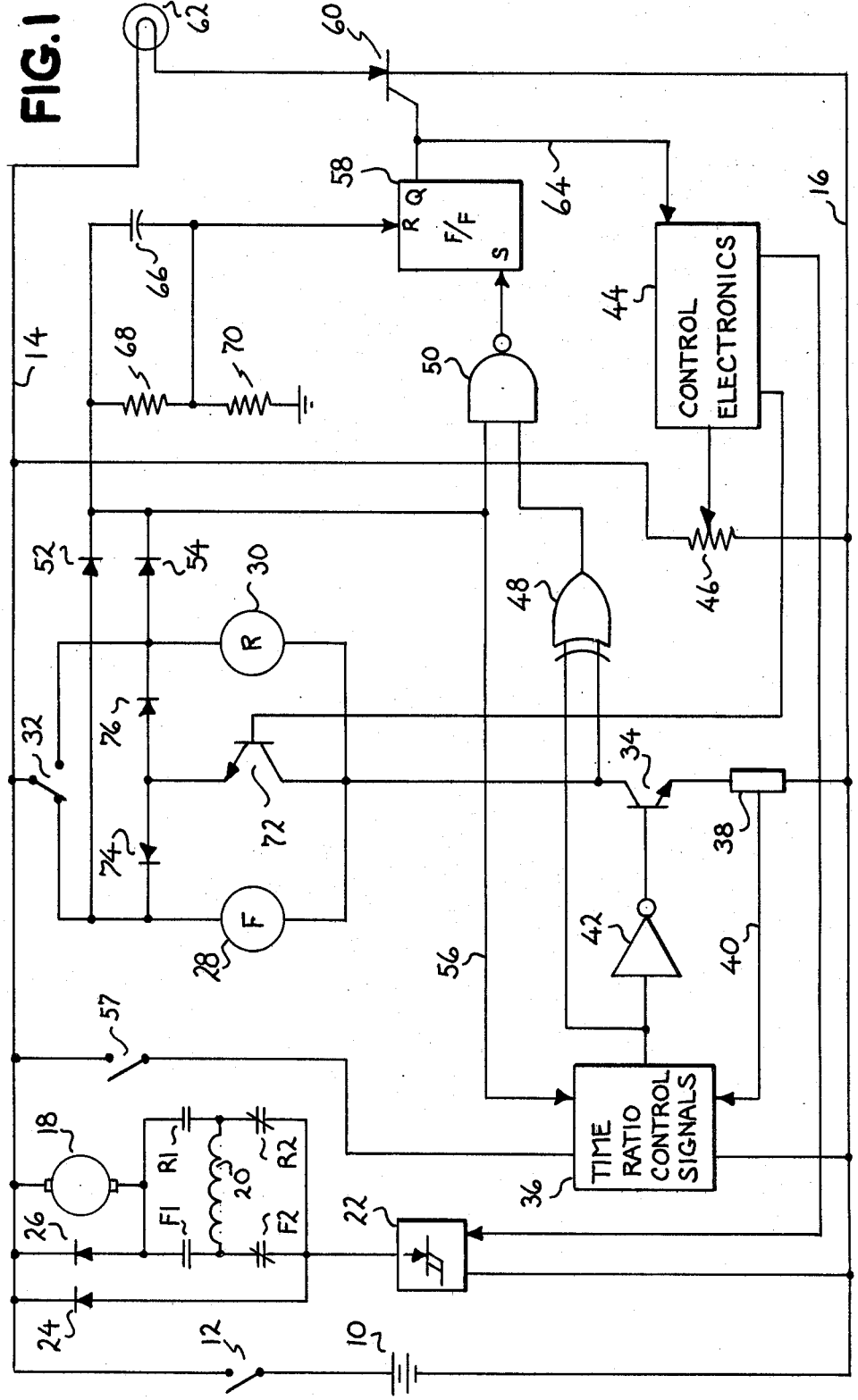
FIG. 1 is a simplified schematic and block diagram of a control system incorporating the inventive fault indicator circuit to detect misoperation of a time ratio controlled transistor; and, FIG. 2 is an alternate embodiment of the present invention for use with a continuous transistor current regulator.

Referring now to FIG. 1, there is illustrated a simplified schematic diagram of an electrical power control system for a traction motor of an electric vehicle. A battery 10 serially connected with a key switch 12 provides power to a relatively positive bus 14 and a relatively negative bus 16. A traction motor comprising an armature 18 and a field winding 20 is arranged to be serially connected between the power busses 14 and 16 by means of a plurality of contacts F1, F2, R1 and R2 and a time ratio control chopper circuit 22. The contacts F1, F2, R1 and R2 are shown in their normal de-energized state. A free-wheeling diode 24 connected in parallel with the series combination of armature 18 and field winding 20 provides a current path for motor current during the non-conducting time period of chopper circuit 22. A braking diode 26 connected in parallel with the motor armature 18 provides a reverse armature current path to prevent self-excitation during braking.

The contacts F1 and F2 are controlled by a contactor actuating coil 28 while the contacts R1 and R2 are controlled by a contactor actuating coil 30. The actuating coils 28 and 30 are connected between the power busses 14 and 16 by means of a multi-position switch 32 and a current regulating transistor 34. The current regulating transistor 34 is provided to allow relatively high current when the contactors coils are initially energized but to regulate a relatively low holding current once the contacts have been picked up. This arrangement prevents unnecessary power loss in a battery powered vehicle and also reduces the heating effects caused by large currents in the contactor coils.

The transistor 34 is controlled by time ratio control signal source 36 of a type well known in the art. The source 36 initially produces control signals to force a high conduction rate for the transistor 34 and then subsequently switches to a current regulating mode in which a current feedback signal is coupled from a current shunt 38 connected in an emitter circuit of transistor 34 via line 40 to the source 36. Since the transistor 34 is preferably an NPN type device having a collector terminal connected to the coils 28 and 30 and an emitter terminal connected to the bus 16, the control signals from source 36 are coupled through an inverter circuit 42 to a base terminal of the transistor 34. Accordingly, a control signal having a relatively positive potential state at the output terminal of source 36 will be inverted to a relatively negative potential state at the output terminal of the inverter 42 to thereby cause the transistor 34 to become non-conductive whereby its collector potential will rise to a positive potential state. Thus, in the illustrated embodiment, the state of the collector terminal of transistor 34 will follow the state of the control signal provided by the source 36.

The chopper circuit 22 regulates the current through the motor armature 18 and in turn is controlled by a control electronics circuit 44 of a type well known in the art. A potentiometer 46 has a moveable arm which provides a variable input signal to the control electronics circuit 44. The potentiometer 46 represents an accelerator control for the motor comprising the armature 18 and field winding 20. A more detailed description of the electronics circuit 44 and its interaction with the chopper circuit 22 can be found in U.S. Pat. No. 3,843,912, issued Oct. 22, 1974 and assigned to General Electric Company.

In order to verify the proper operation of the transistor 34, its conduction state, i.e., whether it is conducting or nonconducting, is compared to the state of the command signal from the control signal source 36. This comparison is achieved by connecting the collector terminal of transistor 34 to a first input terminal of an exclusive OR circuit 48. A second input terminal of exclusive OR circuit 48 is connected to the output terminal of the control signal source 36 to monitor the state of the control signals. The exclusive OR circuit 48 is chosen for this comparison since it provides a logical one output signal only when the state of the two input signals are different. Although the state of the output signal from the exclusive OR circuit 48 can be used as an energizing signal to indicate a failed condition of transistor 34, there is provided an additional logic circuit 50 which tests to assure that power has been applied to the contactor coils 28 and 30 before the energizing signal is allowed to present an alarm condition. The logic circuit 50 is illustrated as a NAND logic gate having a first input terminal connected to an output terminal of the exclusive OR circuit 48. A second input terminal of logic circuit 50 is connected to monitor the voltage applied to the coils 28 and 30 by means of an OR circuit comprising diodes 52 and 54. The anode terminal of diode 52 is connected to a junction intermediate the switch 32 and coil 28 while the anode of diode 54 is connected to a junction intermediate the switch 32 and coil 30. The cathode terminals of each of the diodes 52 and 54 are connected to the second input terminal of NAND logic circuit 50.

It will be noted that the cathode terminals of diodes 52 and 54 are also coupled via a line 56 to an input terminal of the time ratio control signal source 36. This latter connection is provided to inhibit the operation of the source 36 until such time as power is actually applied to one of the contactor coils 28 and 30. A seat switch 57 also prevents operation of source 36 until a vehicle operator is seated on the vehicle.

An output terminal of the NAND logic circuit 50 is connected to a set input terminal of a flip-flop 58. The flip-flop 58 is utilized to provide a latched output whenever a misoperation of the transistor 34 is detected. A Q output terminal of the flip-flop 58 is connected to a gate terminal of a silicon controlled rectifier (SCR) 60. The SCR 60 is connected in a series circuit with a lamp 62 between the power buses 14 and 16. Accordingly, when a gate signal is applied to the SCR 60 and gates it into conduction, a current path is provided for the lamp 62 to thereby cause the lamp to be illuminated and provide a visual indication of a failure of the transistor 34. In a preferred embodiment, the Q output terminal flip-flop 58 is also connected via a line 64 to an input terminal of the control electronics circuit 44 to thereby inhibit the operation of the circuit 44 and force the chopper circuit 22 to become nonconductive whereby power is removed from the traction motor.

The flip-flop 58 is reset by moving the position switch 32 from a forward-to-reverse or reverse-to-forward position (or by the initial application of power to the system). The reset is accomplished by connecting the cathode terminals of the diodes 52 and 54 through a differentiation circuit including a capacitor 66 to a reset terminal of the flip-flop 58. A resistor 68 connected in parallel with the capacitor 66 and a resistor 70 connected between the reset terminal of flip-flop 58 and ground provide a discharge path for the capacitor 66 so that a short time-constant reset pulse is developed each time the switch 32 is moved between the forward and reverse positions.

Since the current through the coils 28 and 30 is regulated by chopping action of transistor 34, there is provided a free-wheeling path around each of the inductive coils by a transistor 72 and a pair of free wheeling diodes 74 and 76. During normal operation, the transistor 72 is maintained in conduction by means of a signal applied to its gate terminal from the control electronics circuit 44. However, when it is desired to drop out either the forward or reverse contactor very rapidly, the gating signal to the transistor 72 is removed thereby forcing it to become nonconductive and removing the low resistance free-wheeling current path from the contactor coils. With higher resistance in the contactor coil current discharge path, the rate of discharge is greatly increased.

Figure 2:
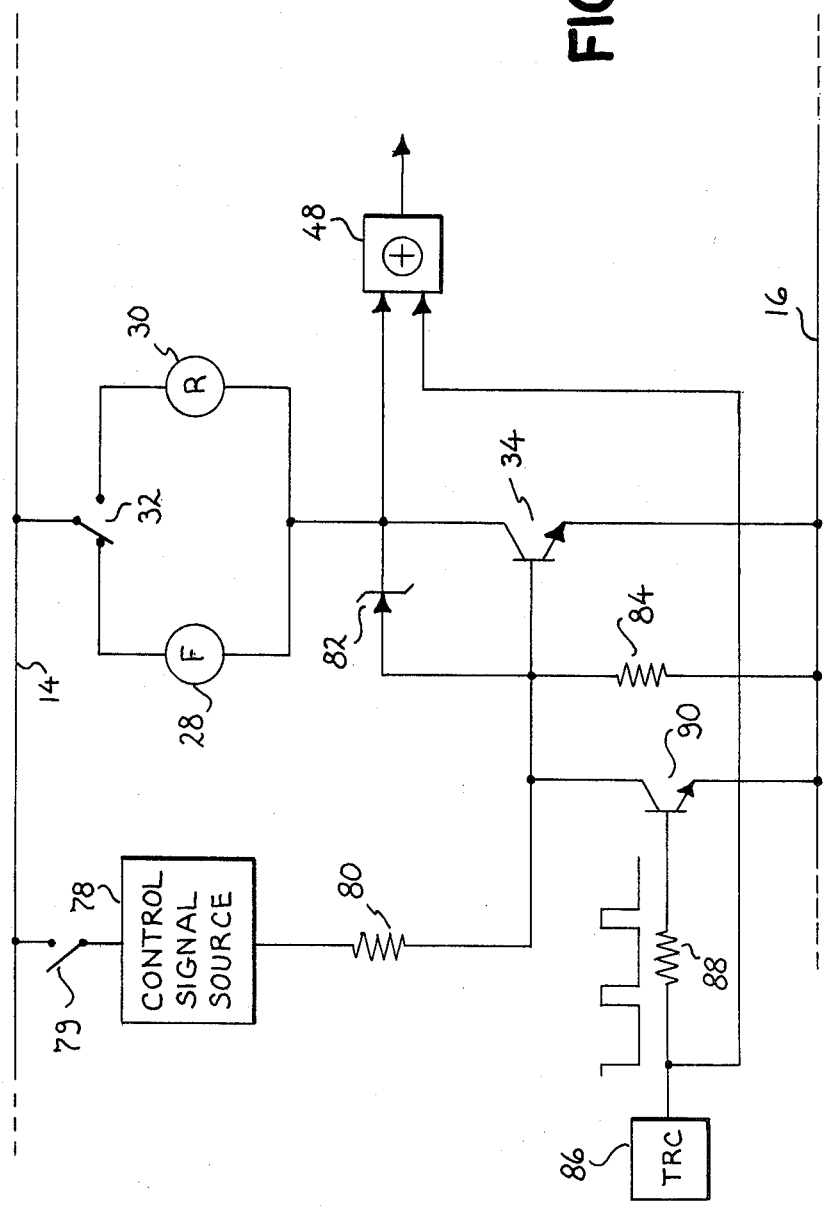

The circuit of FIG. 1 depends in its operation upon the fact that the control signals applied to the transistor 34 are time ratio control signals which periodically change states. Accordingly, the change of state of transistor 34 can be monitored by the exclusive OR circuit 48 and misoperation readily detected. Referring now to FIG. 2, there is shown an alternate arrangement of the present invention in which the transistor 34 is connected to regulate the current through the contactor coils 28 and 30 by being maintained in a continuously conducting condition. A control signal source 78, which may be responsive to actuation of the key switch 12 and to a seat switch 79 or to other safety devices, provides a gating signal through a current limiting resistor 80 to the base terminal of transistor 34. The gating signal is not provided until such time as all the safety contactors have been energized. Accordingly, transistor 34 acts as a safety device to prevent power from being applied to contactor coils 28 and 30 until the operator is ready. A zener diode 82 connected between the base and collector terminals of transistor 34 assures that current spikes developed by the inductive reactance of coils 20 and 30 do not exceed the base collector breakdown voltage on transistor 34. A base bias resistor 84 connected between the base and emitter terminals of transistor 34 allows development of a base emitter bias voltage.

Since the transistor 34 is maintained in a normally conductive mode the exclusive OR circuit 48 would be unable to detect a shorted condition of the transistor 34 until such time as the control signal had been removed from the transistor. Since removal of this control signal at the base of the transistor 34 normally occurs at the same time the power is removed from the system, the failure of transistor 34 might go undetected and result in actuation of the contactor coils 28 and 30 at an undesirable time. Accordingly, there is provided a gate signal source circuit 86 which provides periodic output pulses of a short time duration. The time between the output pulses is preferably relatively long with respect to the time duration of the pulses. The output pulses developed by the circuit 86 are coupled through a base bias resistor 88 to a base terminal of a transistor 90. The transistor 90 has its collector terminal connected to the base terminal of transistor 34 and its emitter terminal connected to the relatively negative pulse 16. When a positive pulse from the circuit 86 is delivered to the base of the transistor 90, the transistor 90 is gated into conduction thereby short circuiting the base emitter junction of the transistor 34 causing it to be momentarily nonconductive. As a result, the voltage at the collector terminal of transistor 34 will rise very quickly toward the voltage on the bus 14. This voltage rise at the collector terminal of transistor 34 can be compared with the positive voltage pulse from the circuit 86 to detect proper operation of the transistor 34. Accordingly, one input terminal of the exclusive OR circuit 48 is connected to the collector terminal of transistor 34 and the other input terminal of OR circuit 48 is connected to the output terminal of the circuit 86. If the transistor 34 fails to respond to the positive pulse from the circuit 86, an energizing signal will be developed by the exclusive OR circuit 48 and, as described with respect to FIG. 1, can be utilized to signal that the transistor 34 has malfunctioned or to actually deenergize the entire control system.

It will now be seen that the present invention provides a novel method of detecting failure of a transistor in an operating system. Further, the invention allows the early detection of a failure and includes apparatus for indicating the failure and shutting down the system before misoperation can result in an unsafe condition.

As will be evident from the foregoing description, certain aspects of the invention are not limited to the particular details of the examples illustrated and it is therefore contemplated that other modifications or applications will occur to those skilled in the art. It is accordingly intended that the appended claims shall cover all such modifications and applications as do not depart from the true spirit and scope of the invention.

What is claimed is:

1. The fault indicator circuit for a first transistor having a base terminal, a collector terminal and an emitter terminal, the first transistor being connected in a series current path between a power source and a load, a source of control signals for selectively switching the first transistor between a conducting and a nonconducting state and means for coupling the control signals to the base terminal of the first transistor, the indicator circuit comprising:
   (a) switching means connected for selectively short circuiting the control signals applied to the base terminal of the first transistor whereby the first transistor is rendered nonconducting;
   (b) a source of gating pulses;
   (c) means for coupling said gating pulses to said switching means, said switching means being responsive to said gating pulses for short circuiting said control signals;
   (d) means connected for comparing the state of the gating pulses to a corresponding state of conduction of the first transistor, said comparing means providing an energizing signal upon detection of a difference between the gating pulse state and the state of conduction of the first transistor; and,
   (e) means responsive to said energizing signal for providing a fault indication.

2. The fault indicator circuit of claim 1 wherein said switching means comprises a second transistor of an NPN type having a collector-emitter junction connected across a base-emitter junction of the first transistor.

3. The fault indicator circuit of Claim 1 wherein said comparing means comprises an exclusive OR circuit having a first input terminal connected to receive said gating pulses and a second input terminal connected to monitor the state of conduction of the first transistor.

4. The fault indicator circuit of claim 3 wherein the load comprises a plurality of electromechanical contactor coils and a multiposition switch for selectively connecting at least one of the coils in series circuit with the collector-emitter junction of the first transistor, the circuit further comprising:
   (a) an OR circuit having a plurality of input terminals, each input terminal being connected to a corresponding one of the contactor coils whereby said OR circuit provides an output signal when power is applied to any one of the coils;
   (b) a NAND logic circuit having a first input terminal connected to receive said output signal from said OR circuit and a second iput terminal connected to receive said energizing signal, whereby said energizing signal is inhibited until at least one of said coils has been connected to the power source;
   (c) a bistable flip-flop having a Q output terminal and having a set input terminal connected to an output terminal of said NAND circuit;
   (d) a lamp;
   (e) a silicon controlled rectifier arranged for connecting said lamp in a series circuit across the power source; and,
   (f) means for connecting the Q output terminal of said flip-flop to a gate terminal of said controlled rectifier.

5. The fault indicator circuit of claim 4 wherein said flip-flop includes a reset terminal, the circuit including a differentiation circuit for connecting the output terminal of said OR circuit to said reset terminal whereby said flip-flop is reset with each change in position of said multiposition switch.

6. A fault detection circuit for a normally conductive transistor regulating current to a load, comprising:
   first means providing a train of periodic pulses having a time duration between pulses which is relatively long with respect to the pulse time duration;

second means receiving said pulses and responsive thereto to cause said transistor to switch to a non-conductive state during said pulse time duration;

logic means simultaneously receiving said train of periodic pulses and a signal from said transistor which is indicative of the conductive state thereof, said logic means being responsive to said pulses and said signal to produce an output signal indicative of a fault in said transistor whenever said transistor remains in a conductive state simultaneously with the occurrence of said pulse time duration.

7. The fault detection circuit of claim 6 wherein said second means comprises a switching means connected between the base and emitter terminals of said transistor, said switching means being responsive to said pulse duration to produce a short-circuit between said base and emitter terminals.

8. The fault detection circuit of claim 7 wherein said logic means comprises an exclusive OR circuit having a first input terminal connected to receive said train of periodic pulses and a second input terminal connected to receive the signal indicative of the conductive state of said transistor.

9. The fault detection circuit of claim 8 wherein said switching means comprises a second transistor.

* * * * *